United States Patent [19]
Nita et al.

[11] Patent Number: 5,629,615
[45] Date of Patent: May 13, 1997

[54] OSCILLOSCOPE CASING STRUCTURE

[75] Inventors: Fujio Nita, Sayama; Kazuya Natori, Kodaira, both of Japan

[73] Assignee: Hitachi Denshi Kabushiki Kaisha, Tokyo, Japan

[21] Appl. No.: 309,737

[22] Filed: Sep. 21, 1994

[30] Foreign Application Priority Data

Sep. 21, 1993 [JP] Japan .................................. 5-257694
Sep. 25, 1993 [JP] Japan .................................. 5-056494 U

[51] Int. Cl.$^6$ ............................................. G01R 13/20
[52] U.S. Cl. ................................. 324/121 R; 324/156
[58] Field of Search ............................. 324/121 R, 156; D10/76; D18/7; D14/100; 292/41

[56] References Cited

U.S. PATENT DOCUMENTS

| | | | |
|---|---|---|---|
| D. 293,556 | 1/1988 | Klojcnik | D10/76 |
| D. 319,651 | 9/1991 | Hu Huang | D18/7 |
| D. 335,123 | 4/1993 | Smiley | D14/100 |
| D. 358,340 | 5/1995 | Murata et al. | D10/76 |
| 3,978,470 | 8/1976 | McGuire | 340/342 |
| 5,011,198 | 4/1991 | Gruenberg et al. | 292/41 |

FOREIGN PATENT DOCUMENTS

| | | |
|---|---|---|
| 443270 | 4/1992 | Japan . |
| 2544489 | 10/1975 | Netherlands . |

OTHER PUBLICATIONS

EDN, vol. 28, No. 19, Sep. 1983, US pp. 80–84; Small "Digital Oscilloscope traces with Liquid–Crystal color shutter".

New Electronics, vol. 15, No. 12, Jun. 1982, pp. 28–32 Murch et al. "Colour–The logical Step" p. 31, left column, para 4 and 5.

Elektronik, vol. 37, No. 1, Jan. 1988, DE pp. 90–93 "Digital –Speicheroszilloskop mit" p. 91, right column, last paragraph.

Klein, Stark, schnell: Das Multiscope, Sep. 1987, Philips, De.

Brown Boveri Technik, Jan. 1986, DE pp. 47–51, Haussel "Ein neues Messgerat zum gleichzeitigen Messen" abstract, Fig. 1.

Electronics Australia, vol. 47, No. 10, Oct. 1985, AU pp. 62–73 L. Simpson "Liquid Crystal" pp. 63, 67, 71.

Elektronik, vol. 35, No. 8, Apr. 1986., DE pp. 126–130 "Messplatz fur die Westentaschi" abstract, FIGS. 1, 3.

Journal Electr. Eng., vol. 13, No. 326, Feb. 1994, JP pp. 34–37 Okada "color TFT LCD Forms Core of B5 Notebook Color Oscill".

*Primary Examiner*—Ernest F. Karlsen
*Assistant Examiner*—Russell M. Kobert
*Attorney, Agent, or Firm*—Antonelli, Terry, Stout & Kraus, LLP

[57] ABSTRACT

An oscilloscope of the following type is disclosed. Even though a main unit of the oscilloscope is horizontally placed, a display can be adjusted at an optimal angle. Also, while the main unit remains in such a position, press buttons can be depressed stably. An operating section is covered in the case of carrying the oscilloscope and knobs of the operating section, and the like, can be kept out of the way, thereby not hampering portability. An oscilloscope casing is divided into a display section and an operating section. A part of the top surface of the main unit is lowered and the operating section is placed on the lowered surface. The display section doubles as a cover for the operating section and is pivotally fixed to the top surface of the main unit via a hinge so as to freely open and close. The display section has a display screen inside and forms the top surface of the main unit and covers the operating section outside when the display section is closed.

5 Claims, 12 Drawing Sheets

OSCILLOSCOPE CASING STRUCTURE

BACKGROUND OF THE INVENTION

1. Field of the Invention

The present invention relates to a portable oscilloscope casing structure and to a digital color oscilloscope which is improved in operational performance.

2. Description of the Related Art

Conventionally, in addition to a typically-shaped portable oscilloscope, a further downsized oscilloscope is available such that it is actuated by a battery and employs a plane-type display, such as a liquid crystal display.

Figure 15:
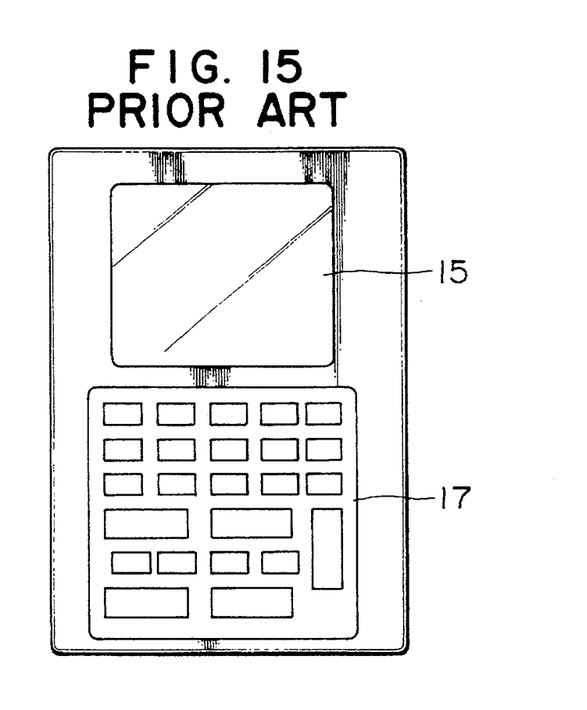
FIG. 15 is a front view of a conventional oscilloscope.
Figure 16:
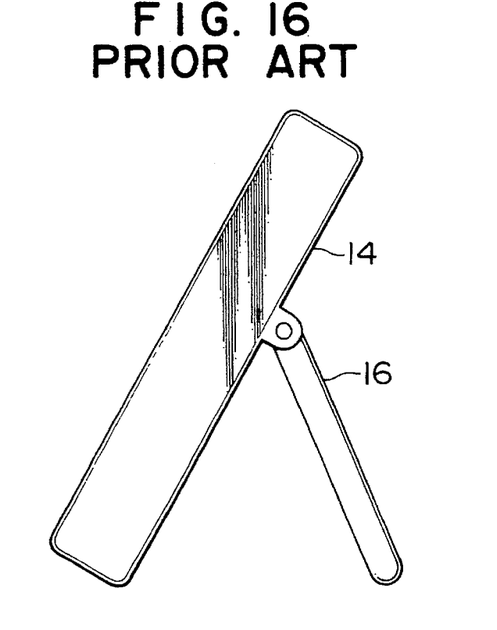
FIG. 16 is a side view of the conventional oscilloscope.

FIGS. 15 and 16 show one example of a portable digital oscilloscope using such a plane-type display. FIG. 15 is a plan view of such an oscilloscope. FIG. 16 is a side view of the oscilloscope in its standing position. As is seen from FIGS. 15 and 16, the conventional digital oscilloscope is characterized in than an operating surface 17 and a display surface 15 are integrally formed with each other on the same plane. A viewing angle adjustment mechanism for observing the display surface 15 is constructed in such a way that a stand 16 arranged at the rear of the main unit is used to raise and support a bottom 14 of the main unit. The adjustment range of the stand 16 is from one to two steps.

Accordingly, the stand 16 is used to tilt the operating surface 15. In order to make the surface of the oscilloscope casing as even as possible for achieving easy carrying, press button switches and volumes are largely used for the operating system.

However, the conventional oscilloscope described above presents the following first problem. It has a narrow adjustment range for obtaining an optimal angle to observe the display surface. The operator has to take the trouble to move his/her own viewpoint in order to obtain an optimal viewing angle. Besides, while the oscilloscope is tilted, the main unit is unstable so that it is likely to be moved by the depression of a button. The press buttons are largely used so that it is particularly difficult to make fine adjustments with fingers for adjusting the position of a waveform, or the like. The use of turning knobs might solve such a problem, but at the same time, it would produce protrusions on the operating surface, which might be inconvenient in the way of carrying the oscilloscope.

In terms of operational performance, there has been suggested the following techniques of differentiating the channels in the conventional multi-channel input digital color oscilloscope: colors of the display waveforms are determined corresponding to the channels; the probe tips and the connecting portions between the probes and the oscilloscope are marked in various colors; and the input channels are displayed on the display screen by way of letters, or the like.

Although these techniques have respective advantages, the operator is required to use the oscilloscope, in consideration of the corresponding relationships between the waveform input probes and the input panels and those between the panels and the waveform display colors, thereby easily leading to erroneous operations and measurements.

Japanese Utility Model Unexamined Publication No. 4-43270 discloses a color oscilloscope of the type which displays in color signal waveforms of a plurality of channels which are input through a plurality of probes, and further describes the following technique. Each of the probes connected to such a color oscilloscope has color-designated information generating means for sending information which is related to a display color allocated to each of the probes. The resultant color-designated information is read by the oscilloscope, thereby determining the display color of the signal waveform.

According to the above-noted technique, the operator can perform the measurements while corresponding the probe color to the display color on the oscilloscope screen, thereby preventing erroneous operations and measurements.

However, according to the above-noted conventional are, although the operator can prevent erroneous operations and measurements when manipulating the above type of oscilloscope, it is necessary that the probes are provided with the color-designated information generating means for sending information related to the display color and that the main unit of the oscilloscope is provided with color information reading means, such as a color sensor, a memory, a CPU, and the like.

Also, the conventional art presents the following second problem. Even though the display color is changed corresponding to the probe as described above, the operator might not be able to see the probe which is visually hidden, in which case, the operator has to visually confirm the corresponding relationship between the part to be measured and the display color. Besides, there might be the possibility of changing the corresponding relationship between the channel and the display color every time a measurement is performed, thereby easily bringing about erroneous operations and measurements.

SUMMARY OF THE INVENTION

Accordingly, in order to solve the foregoing first problem, an object of a first aspect of the present invention is to provide an oscilloscope casing in which a display section can be adjusted at an optimal angle while a main unit is stably placed.

To this end, the oscilloscope casing is divided into a display section and a main unit which is largely used as an operating section. A part of the top surface of the main unit is lowered one step and the operating section is arranged on such a lowered surface. The display section doubles as a cover for the operating section and is pivotally fixed to the top surface of the main unit via a hinge so as to freely open and close. The display section has a display screen inside and forms the top surface of the main unit and covers the operating section outside when the display section is closed.

With the above-mentioned construction, the display section can be raised to a desired position for observation when measurements are being performed. The main unit can be stably placed horizontally and the oscilloscope casing does not lie down caused by the depression of a press button since a force is applied in the direction in which the main unit is stably placed.

Moreover, the display section doubles as a cover for the operating section in the case of carrying the oscilloscope casing. Consequently, knobs, as well as press button switches, can be arranged to project from the operating section and also keep out of the way of carrying the casing.

An object of a second aspect of the present invention is to provide an oscilloscope which solves the foregoing second problem without requiring new electrical means, thereby eliminating erroneous operations and measurements.

In order to eliminate erroneous operations and measurements of a multi-channel input oscilloscope, at least a waveform display and a panel of the operating section are matched in the same color corresponding to each of channels, thereby enhancing operational performance.

As a result, the input factor in the measurements of the oscilloscope, that is, the color of the operating section, can be associated with the measurement output factor, that is, the waveform display color, thereby obtaining a reliable corresponding relationship between a waveform to be displayed, measured and manipulated, and the resultant display waveform.

DESCRIPTION OF THE PREFERRED EMBODIMENTS

Embodiments of the present invention will now be described. FIGS. 1–10 illustrate an embodiment of a first aspect according to the present invention.

Figure 1:
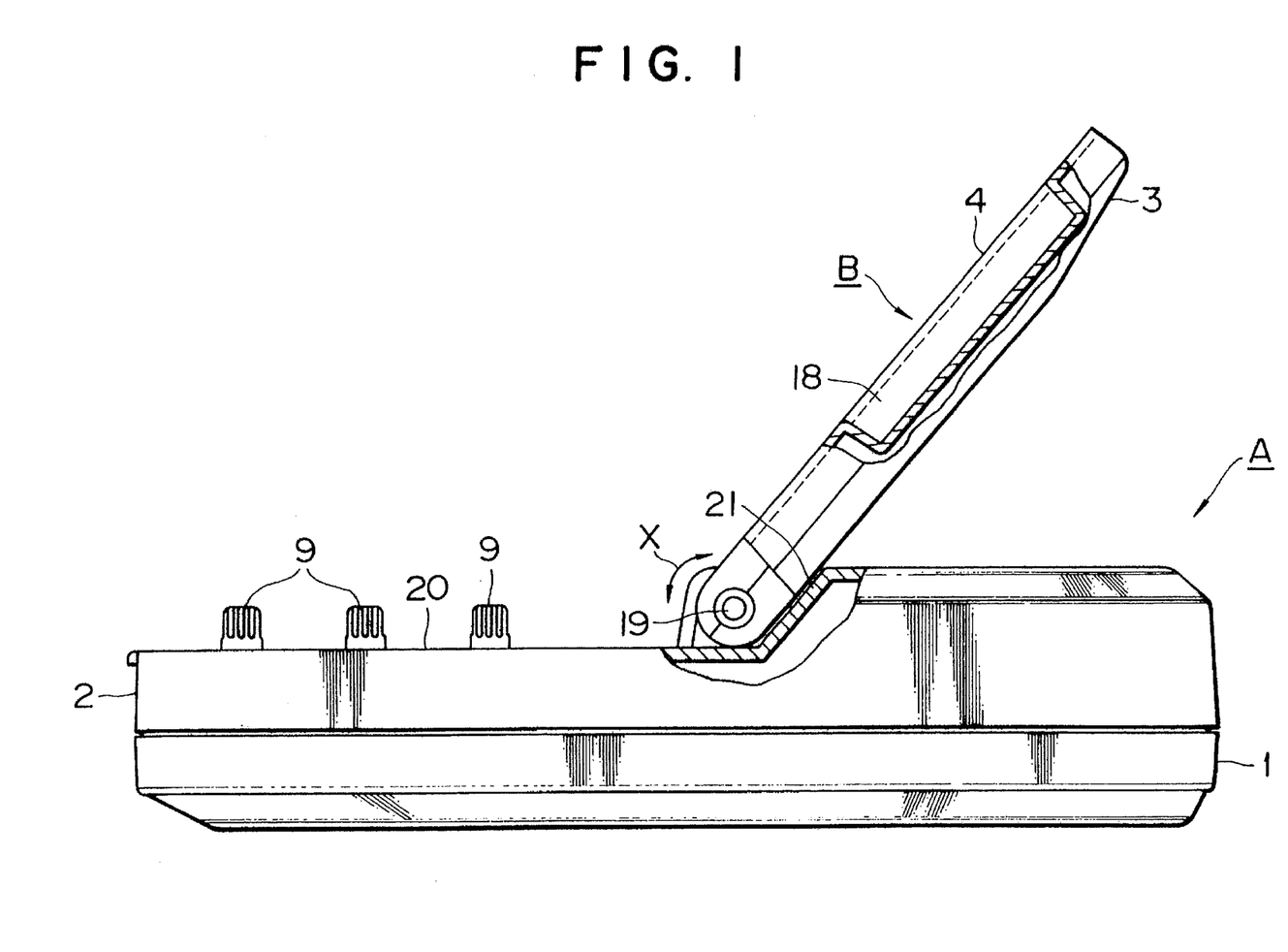
FIG. 1 is a side view of an oscilloscope casing of an embodiment of a first aspect according to the present invention.
Figure 2:
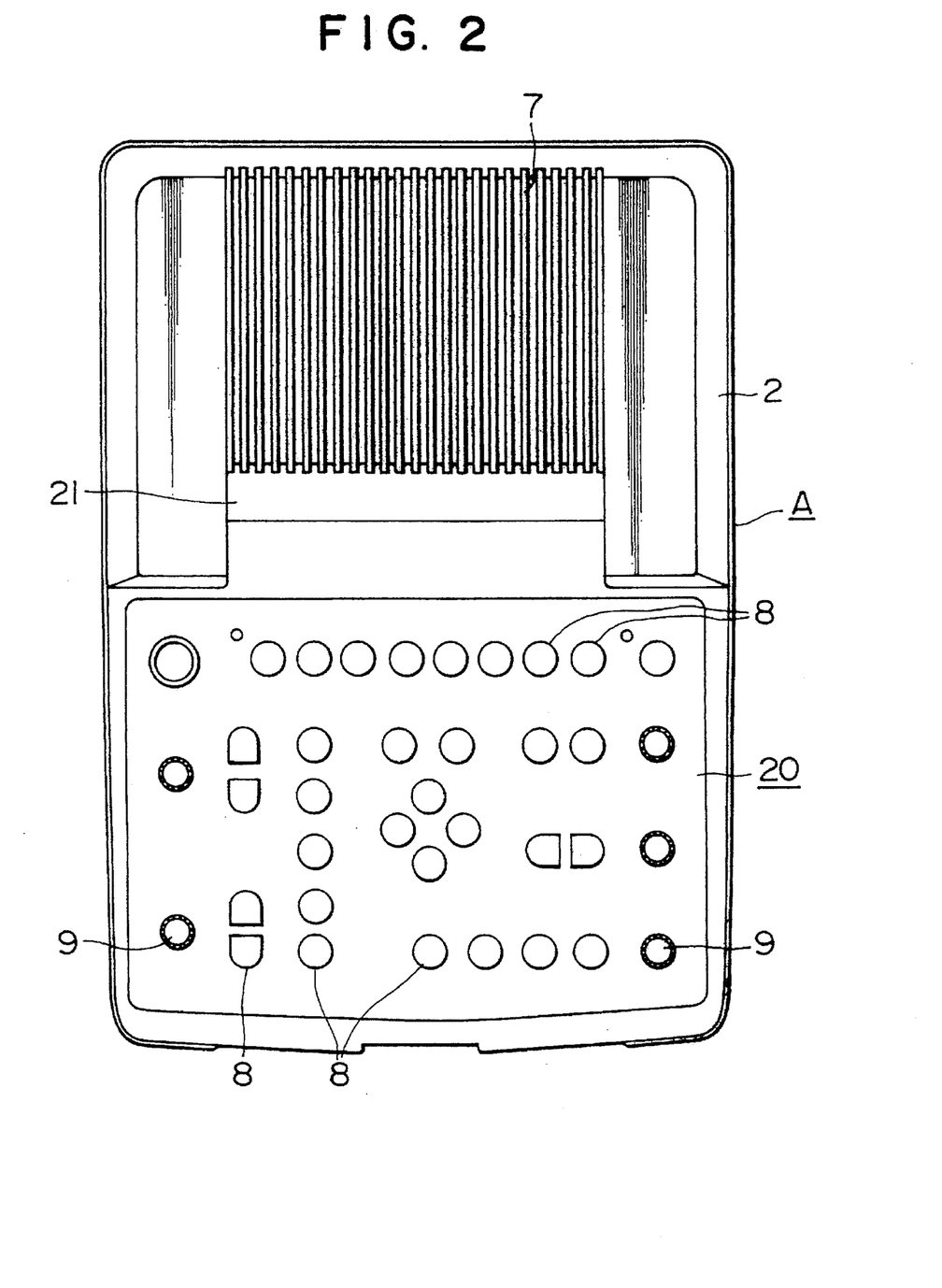
FIG. 2 is a top view of the oscilloscope casing of the embodiment according to the present invention.
Figure 3:
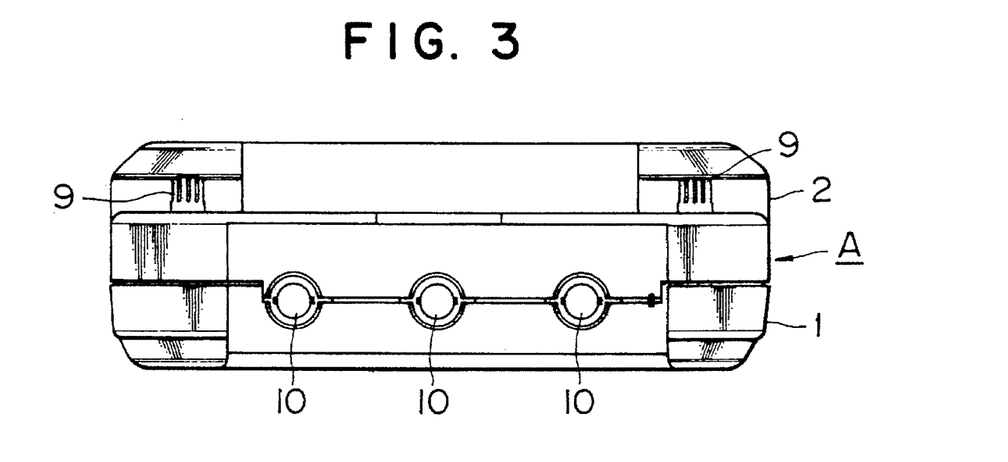
FIG. 3 is a front view of the oscilloscope casing of the embodiment according to the present invention.
Figure 4:
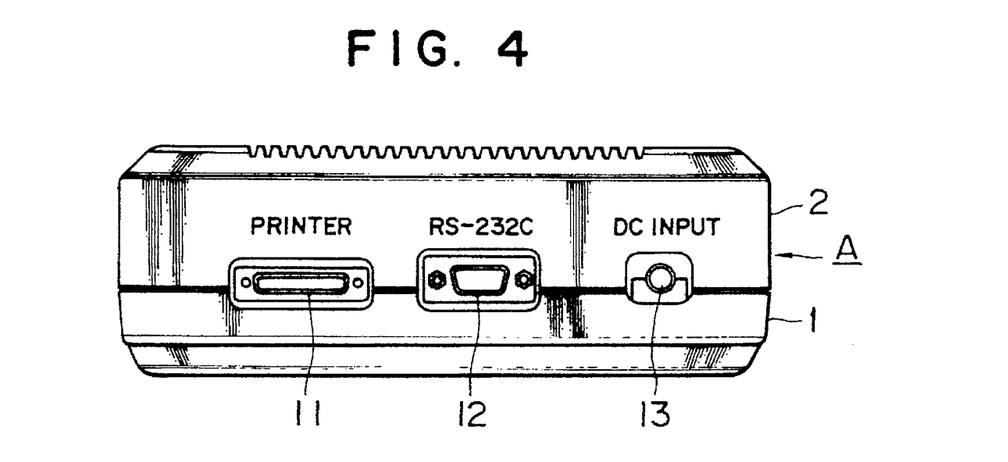
FIG. 4 is a rear view of the oscilloscope casing of the embodiment according to the present invention.
Figure 8:
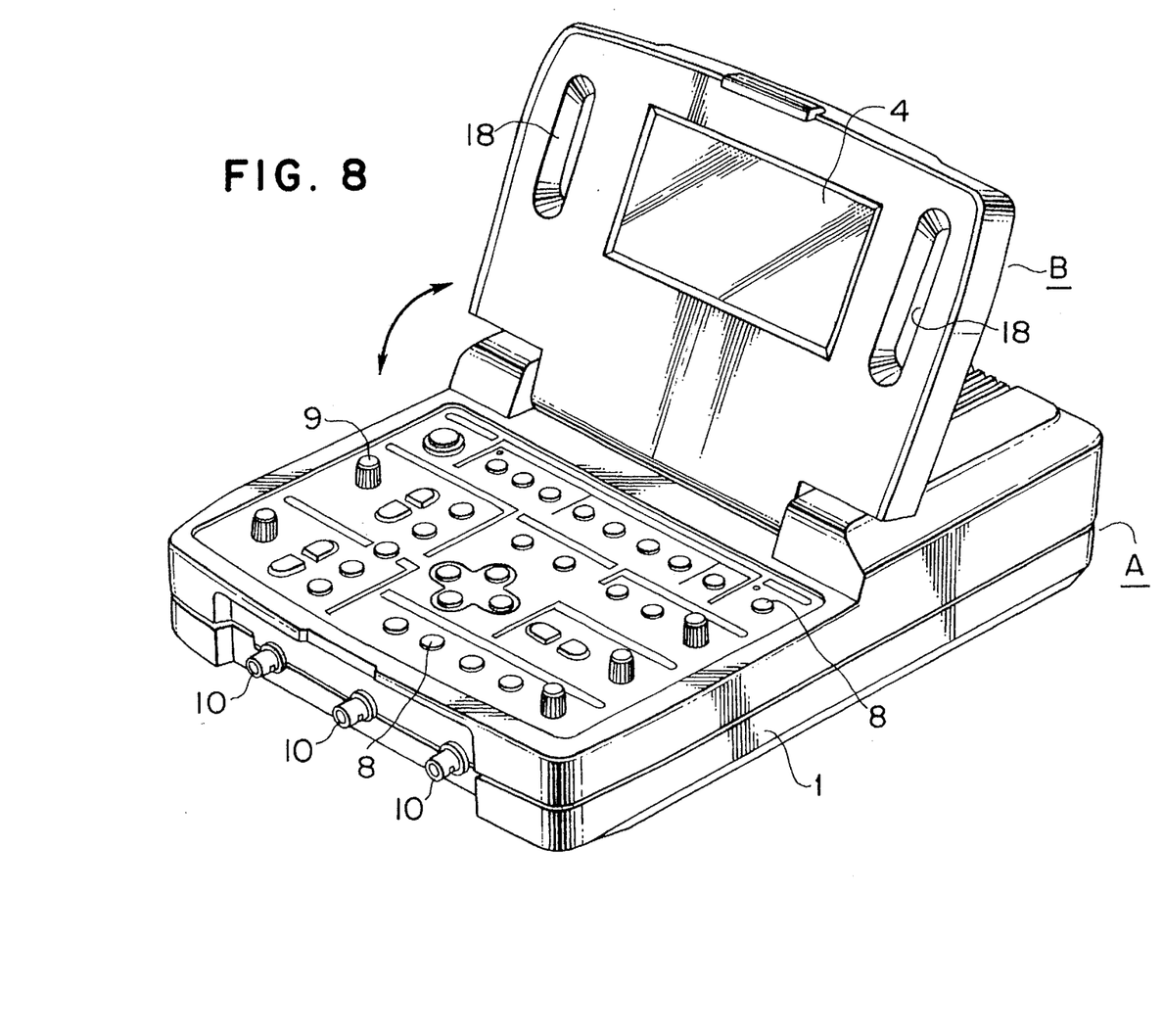
FIG. 8 is a perspective view of the oscilloscope casing of the embodiment according to the present invention and illustrates the display section in an opened position.
Figure 9:
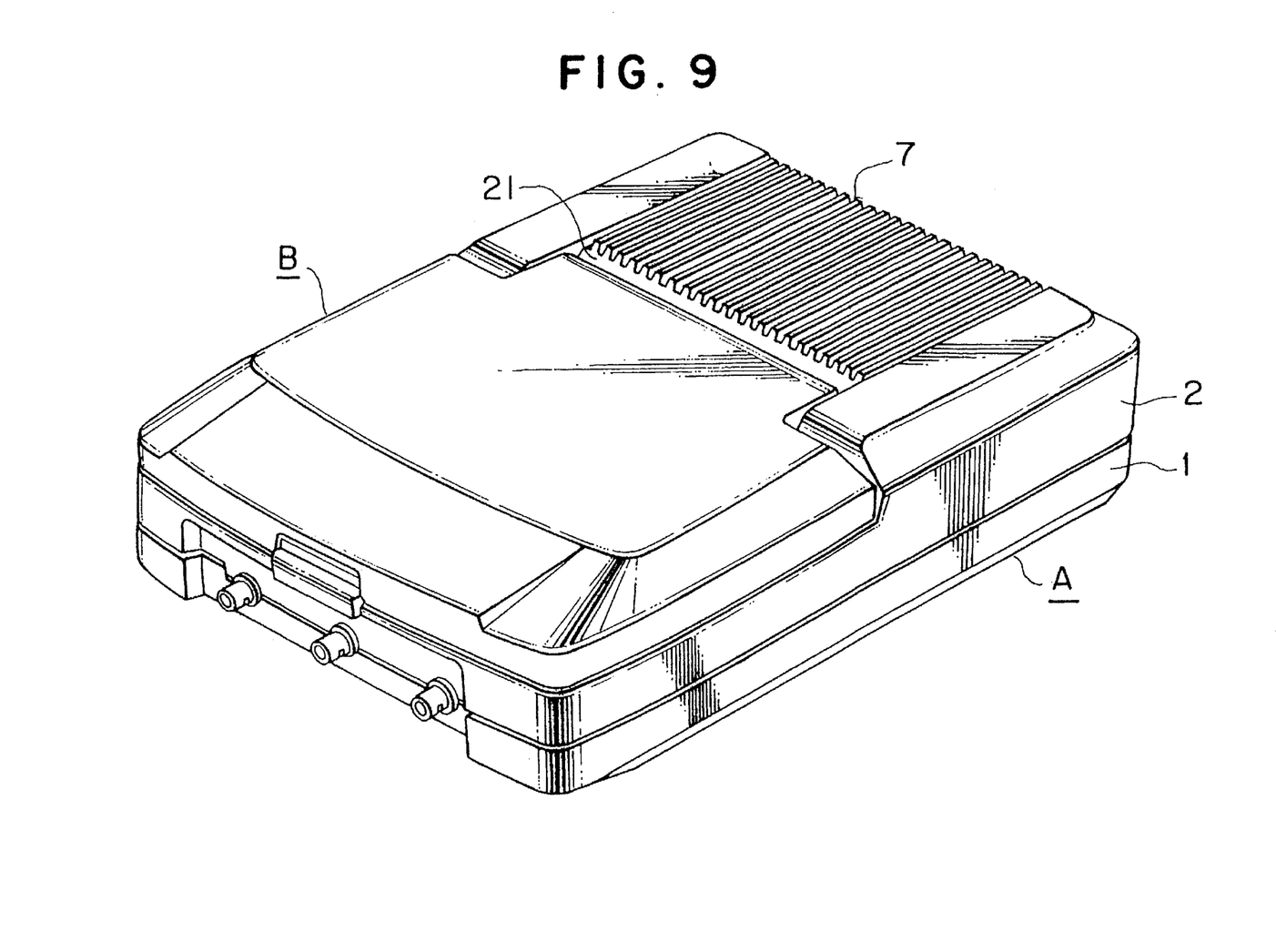
FIG. 9 is a perspective view of the oscilloscope casing of the embodiment according to the present invention and illustrates the display section in a closed position.

Reference will first be made to the primary drawings. FIG. 1 is a partial cutaway side view of an oscilloscope casing and illustrates the display section being opened. FIG. 2 is a plan (top) view of the casing with the display section removed for illustration. FIG. 3 is a front view of the casing with the display section removed for illustration. FIG. 4 is a rear view of the casing. FIG. 8 is a perspective view of the casing with the display section in an opened position. FIG. 9 is a perspective view of the casing with the display section in a closed position.

As is clearly seen from the above-mentioned drawings, the oscilloscope of the present invention largely comprises a main unit A in which electronic circuits (not shown) for the oscilloscope install and a display section B. The main unit A further includes a unit base 1 and a unit cover 2, while the display section B includes a display housing 3 and a display screen 4. As is seen from FIGS. 1 and 3, a front portion comprising substantially half of the top surface of the main unit A (toward the operator) is formed lower than the rear half, and an operating section 20 is arranged on the lowered front surface. The display section B doubling as a cover for this operating section 20 is pivotally fixed to the main unit A via a hinge 19 so as to freely open and close in the direction indicated by the arrow X.

The display section B comprises the display housing 3 and the display screen 4, which contains display (not shown), such as an EL or a liquid crystal display. The external surface of the display section B forms the top surface of the main unit A when the display section B is closed. It is also used as a cover for protecting the operating section 20 and the display screen 4.

A detailed description will now be given of the embodiment.

An explanation will first be given of the operating section 20. In consideration of the need to close the display section B and the operational performance thereof, the operating section 20 arranged at the front part of the unit cover 2 has low-profile operational push buttons 8 at the center and high-profile turning knobs 9 on the right and left sides. The low-profile operational push buttons 8 are arranged at the center of the operating section 20 because a display unit (not shown) is placed substantially at the center of the display housing 3, which center portion must be prevented from being dented. In contrast thereto, the display unit is not included within the right and left sides of the housing 3, which side portions can thus be dented. Taking the advantage of these side portions, in this embodiment, recesses 18 are arranged on the right and left sides of the display screen 4 in a size so as not to contact the protrusions of the operational turning knobs 9 when the display section B is closed (See FIGS. 1 and 8). The high-profile turning knobs 9 can accordingly be placed to fit into these recesses 8, thereby enabling the adjustment of portions which are difficult to be finely adjusted by the press buttons.

Figure 10:
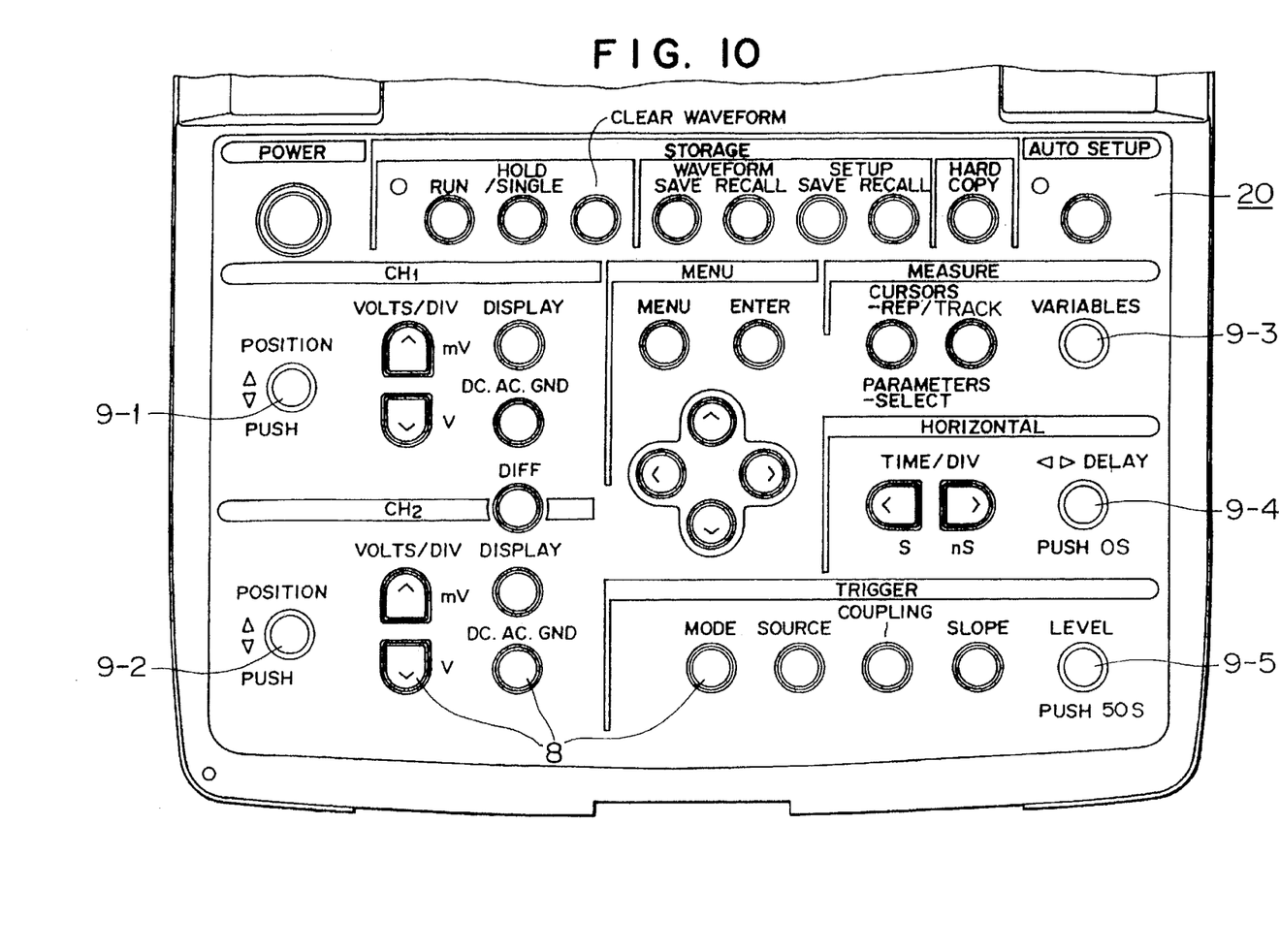
FIG. 10 is a plan view of an operating section of the oscilloscope of the embodiment according to the present invention.

FIG. 10 illustrates the enlarged operating section 20. The operational turning knobs 9 include vertical position knobs 9-1 and 9-2 (CH1 POSITION, CH2 POSITION) for adjusting the display position of a waveform, a cursor position adjustment knob 9-3 (MEASURE VARIABLES), a delay adjustment knob 9-4 (HORIZONTAL DELAY), and a trigger level adjustment knob 9-5 (TRIGGER LEVEL). These knobs are turned so as to perform the fine adjustments which are difficult to achieve by push buttons, thereby significantly improving operational performance. Further, the knobs are arranged on the right and left sides of the operating section 20, thereby also ergonomically enhancing operational performance.

According to the foregoing description, in this embodiment, the turning knobs having good operational performance are not in the way because the recesses 18 provided for the display section B can accommodate the protrusions of the knobs when the casing is carried, that is, when the display section is closed, thus preventing the knobs from being damaged in the case of carrying the casing, thereby enhancing portability and easy handling.

The arrangement of input/output terminals will now be explained.

As shown in FIGS. 3 and 4, the casing structure of this embodiment has input terminals 10 for electrical signals to be observed on the front surface of the main unit A and output terminals 11 and 12 and a power source terminal 13, which are connected to peripheral equipment, on the rear surface thereof. More specifically, one output terminal 11 is connected to an external printer, while the other output terminal 12, which is an RS-232C terminal, is connected to an external computer. The power supply terminal 13 is used for charging a battery (not shown) contained in the main unit A.

As is seen from the drawings, such as FIGS. 3 and 4, because of an intimate relationship with an object, the input terminals 10 are horizontally placed at the center of the front surface of the main unit cover 2 and the base 1, taking operational performance into consideration. That is, since the input terminals 10 are placed in the above-mentioned position, the operator can easily recognize which probe signal is connected to which channel input terminal, thus avoiding a mismatch between a part to be measured and an input terminal.

Moreover, as is seen from the drawings, such as FIGS. 1 and 2, the input terminals 10 are placed one step further inward than the front surface with a view to enhancing portability in the case of carrying the casing and easy handling, and to also protecting the terminals from external shock. Similarly, for the same reasons, the outermost surfaces of the output terminals 11 and 12 and the power supply terminal 13 are also at substantially the same level as the rear surface. Accordingly, the protrusions of the input/output terminals are not shown on the plan (top) views and side views. Instead of being placed on the rear surface, the output terminals and the power source terminal may also be placed on the right and left lateral surfaces.

A description will now be given of the construction of a pivot mechanism of the main unit A and the display section B.

As has been discussed in the foregoing description, the display section B of the oscilloscope of the present invention has a pivot bearing of the hinge 19 which is placed substantially at the rear of the display section B.

Such a pivot bearing is arranged so that while observations are being made, the operator can hold the display screen 4 of the display section, which doubles as a cover, at a desired angle in a range from upward to rearward, as viewed from the front surface of the main unit, so as to pivot (indicated by the arrow X) and fix the display at an optimal viewing angle position. A mechanism for fixing the display at a desired angle can be realized by a known lock mechanism-equipped hinge which is widely used for word processors, and the like, and an explanation thereof will thus be omitted.

Figure 5:
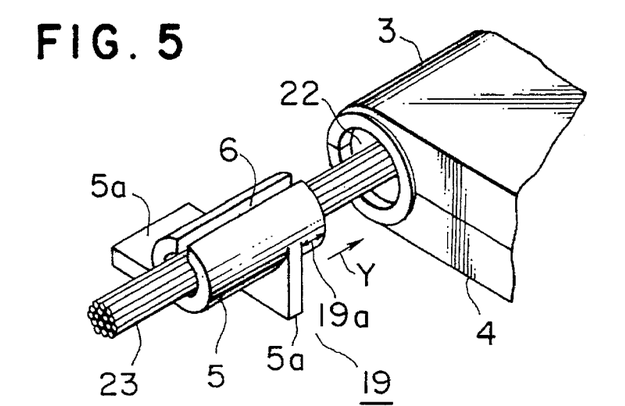
FIG. 5 is a perspective view of a bearing of a pivot hinge of the oscilloscope casing of the embodiment according to the present invention.

A slope 21 (See FIGS. 1, 2 and 9), which tilts forward and downward as viewed from the front surface of the main unit, is arranged at the lateral center of the main unit cover 2. Such a slope 21 serves as a stopper when the display section B is opened to its maximum angle. A mounting plate 5a in FIG. 5 is provided for a stationary shaft 5 for pivoting the hinge 19 so as to be secured to the main unit A, while a portion 19a of the hinge 19 is inserted into a pivot bearing hole 22 provided for the display housing 3 of the display section B, in the direction indicated by the arrow Y. The entire stationary shaft 5 is formed in a hollow tube-like shape so as to receive electrical signal cables 23 for connecting the main unit A and the display section B. In addition, the stationary shaft 5 is axially provided with a slit 6, which remarkably improves in the oscilloscope manufacturing process the workability for attaching the electrical signal cables 23 for connecting a circuit contained in the main unit A of the oscilloscope and with a circuit contained in the display housing 3.

The construction of a ventilation system will now be explained.

This embodiment has a ventilating portion positioned at the lateral center of the top surface of the casing, other than that of the cover for the operating section, and the ventilating portion has a cross section formed of projections and depressions. Ventilating slots are arranged on the lateral surfaces of the above-noted depressions.

Figure 6:
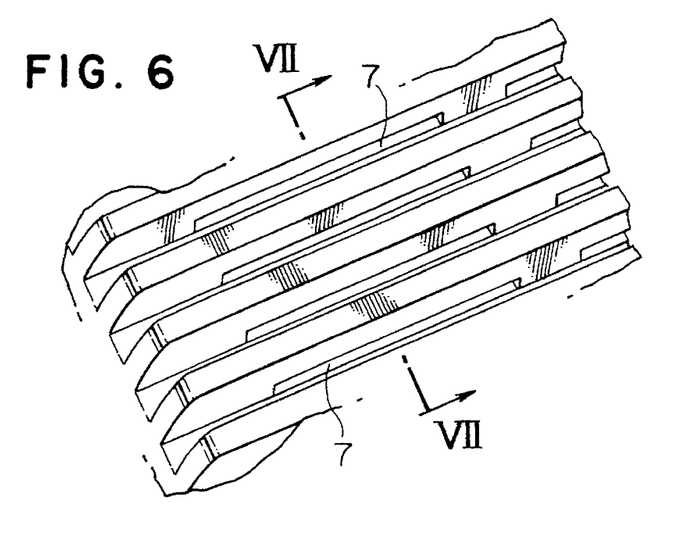
FIG. 6 is a partial perspective view of a ventilation system of the oscilloscope casing of the embodiment according to the present invention.
Figure 7:
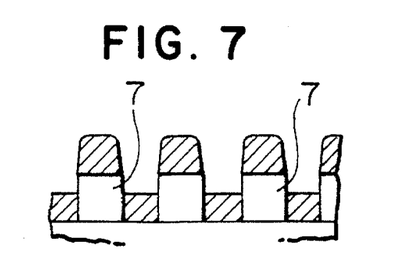
FIG. 7 is a partial sectional view of the ventilation system of the oscilloscope casing of the embodiment according to the present invention.

A more detailed description will be given with reference to FIGS. 6, 7 and 9. FIG. 6 is an enlarged perspective view of the ventilating portion of the oscilloscope casing. FIG. 7 is a sectional view along line VII—VII of FIG. 6. As is seen from FIGS. 6, 7 and 9, ventilating slots 7 having a cross section formed of projections and depressions are arranged in the rear part of the main unit cover 2 in order to dissipate heat. As is seen from FIG. 7, the above-mentioned ventilating slots 7 are arranged on the lateral surfaces of the depressions for the purpose of preventing dust from entering the casing from the top surface.

As is clearly understood from the foregoing description, the oscilloscope casing of a first aspect of the present invention offers the following numerous advantages as a portable oscilloscope.

Even though the main unit of the oscilloscope is kept in the horizontally stable position, the display used for observing the waveform can be adjusted at an optimal angle. Furthermore, while the display remains in such a position, the buttons can be depressed stably since a force is not applied along the movement of the main unit. Also, the turning knobs are employed for the portions required for the fine adjustments, thereby significantly improving operational performance. The operating section can be covered with the display section in the case of carrying the oscilloscope casing, thus keeping the knobs of the operating section, or the like, out of the way, thereby not hampering portability.

A description will now be given of a second aspect of the present invention.

Figure 11:
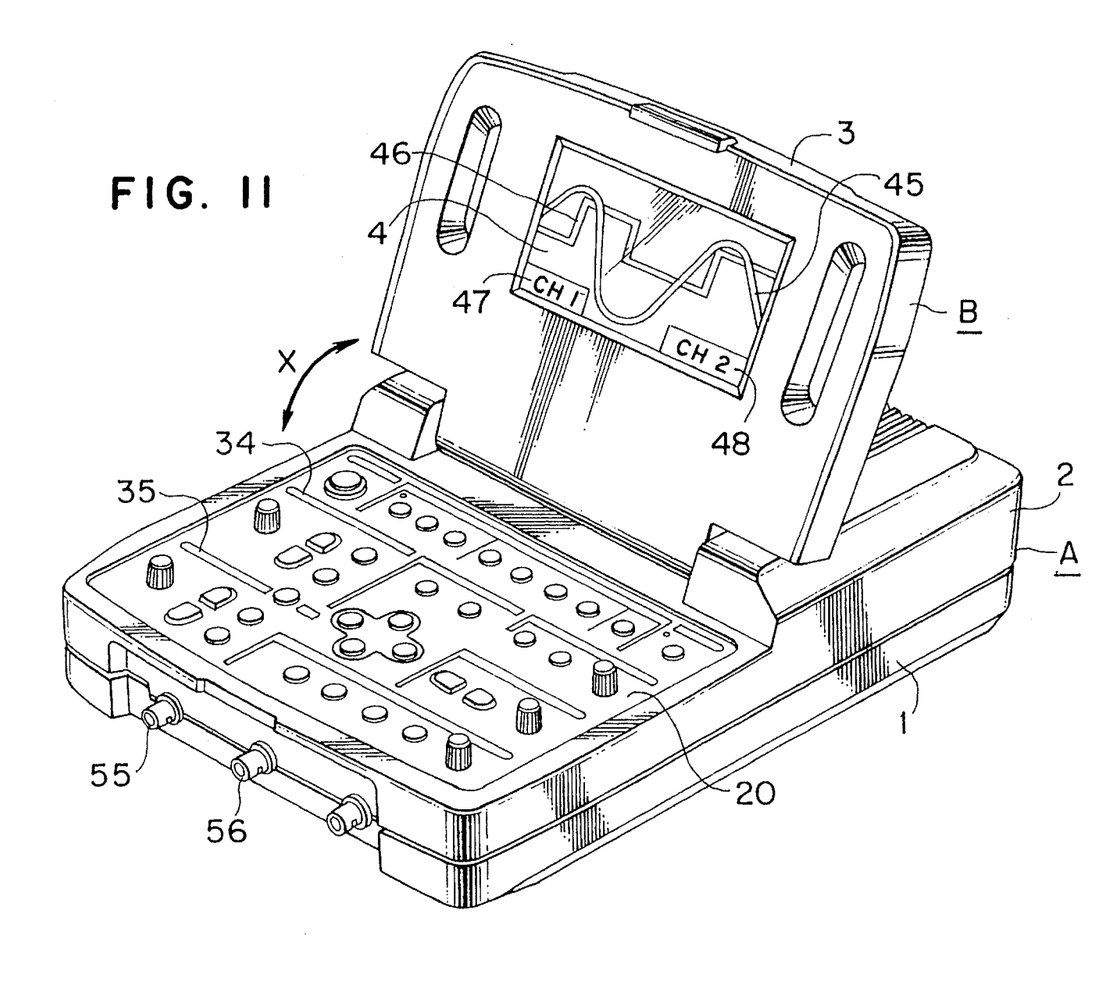
FIG. 11 is a perspective view of an embodiment of a second aspect according to the present invention.

FIG. 11 is a perspective view of an embodiment of the present invention. The same elements as those shown in FIGS. 1–10 have been given the same reference numerals as in FIGS. 1–10. FIG. 11 illustrates waveforms 45 and 46 of channels 1 and 2, respectively, and color displays 47 and 48 designating the channels 1 and 2, respectively.

It will be assumed that the respective waveforms 45 and 46 of the channels 1 and 2 in FIG. 11 are, for example, blue and green, respectively.

A description will now be given of the construction of the operating section 20.

Figure 12:
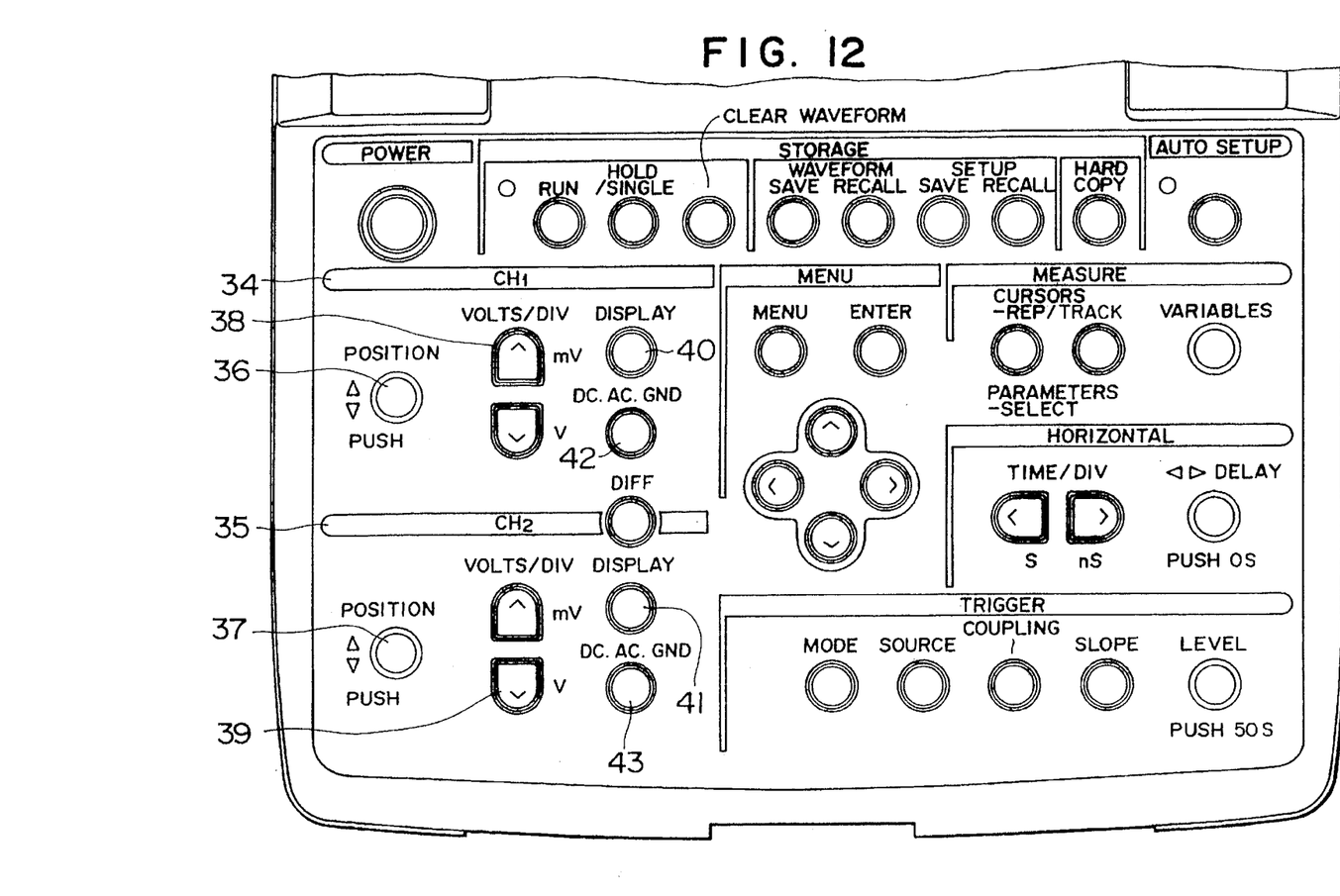
FIG. 12 is a partially enlarged front view of the embodiment of the present invention.

FIG. 12 is an enlarged view of the operating section 20. The channel 1 comprises a vertical position knob 36 (CH1 POSITION), a vertical axis sensitivity adjustment press button 38 (VOLTS/DIV), a waveform display on/off press button switch 41 and an input connection change-over press button switch 42. A color-coding channel display 34 is set to the color of the display waveform 45, for example, blue, in this embodiment. The channel 2 comprises a vertical position knob 37 (CH2 POSITION), a vertical axis sensitivity adjustment press button switch 39 (VOLTS/DIV), a waveform display on/off press button switch 41 and an input connection change-over press button switch 43. A color-coding channel display 35 is set to the color of the display waveform 46, for example, green, in this embodiment.

The waveforms displayed on the oscilloscope have predetermined colors corresponding to the channels. As stated above, the waveforms 45 and 46 of the channels 1 and 2 are displayed in blue and green, respectively. It is now assumed, for example, that the movement of the green waveform 46 is desired. The operating section 20 is observed to find out that the same color as that of the waveform is indicated on the color-coding channel display 35 and to instantaneously recognize that the green color corresponds to the channel 2. Therefore, the position knob 37 is turned to allow the green waveform of the channel 2 to move without fail. The same is applied to the manipulation of the input connection change-over switches 42 and 43 and that of the vertical axis sensitivity change-over switches 38 and 39.

As is seen from FIG. 11, the display screen 4 shows the channel color displays 47 (channel 1) and 48 (channel 2), thereby further clarifying the corresponding relationships between the display waveforms and the channels. For example, when the display waveform is extended off screen by the position adjustment knob, the color displays 47 and 48 are observed to immediately understand which channel display disappears from the screen.

Figure 13:
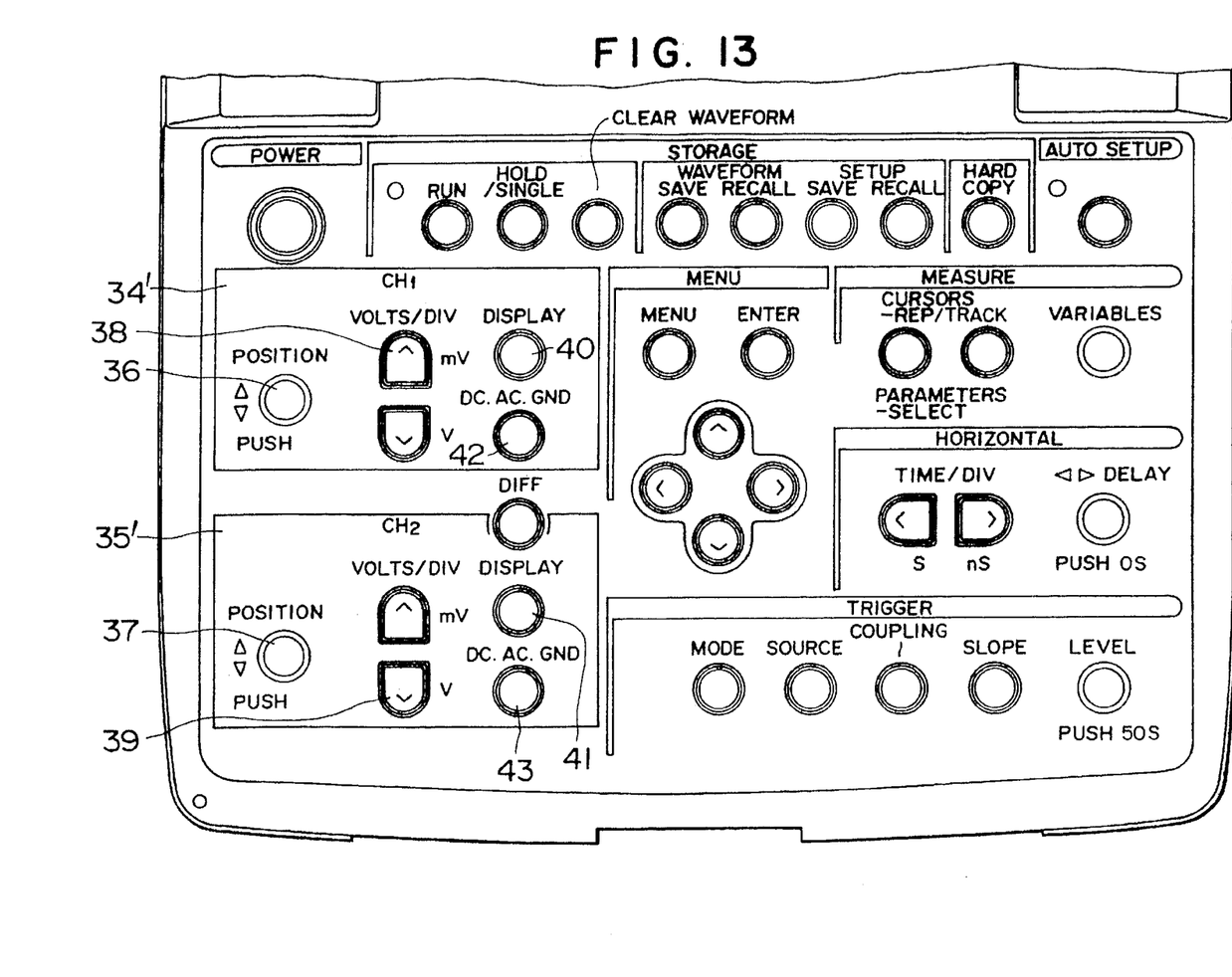
FIG. 13 is a partially enlarged front view of another embodiment of the present invention.

FIG. 13 illustrates another embodiment of the present invention. The channel displays 34' and 35' are formed and colored on the entire surface of each of the channel operating portions of the whole operating section 20, thereby further clarifying the corresponding relationships between the channels and the colors of the display waveforms.

Figure 14:
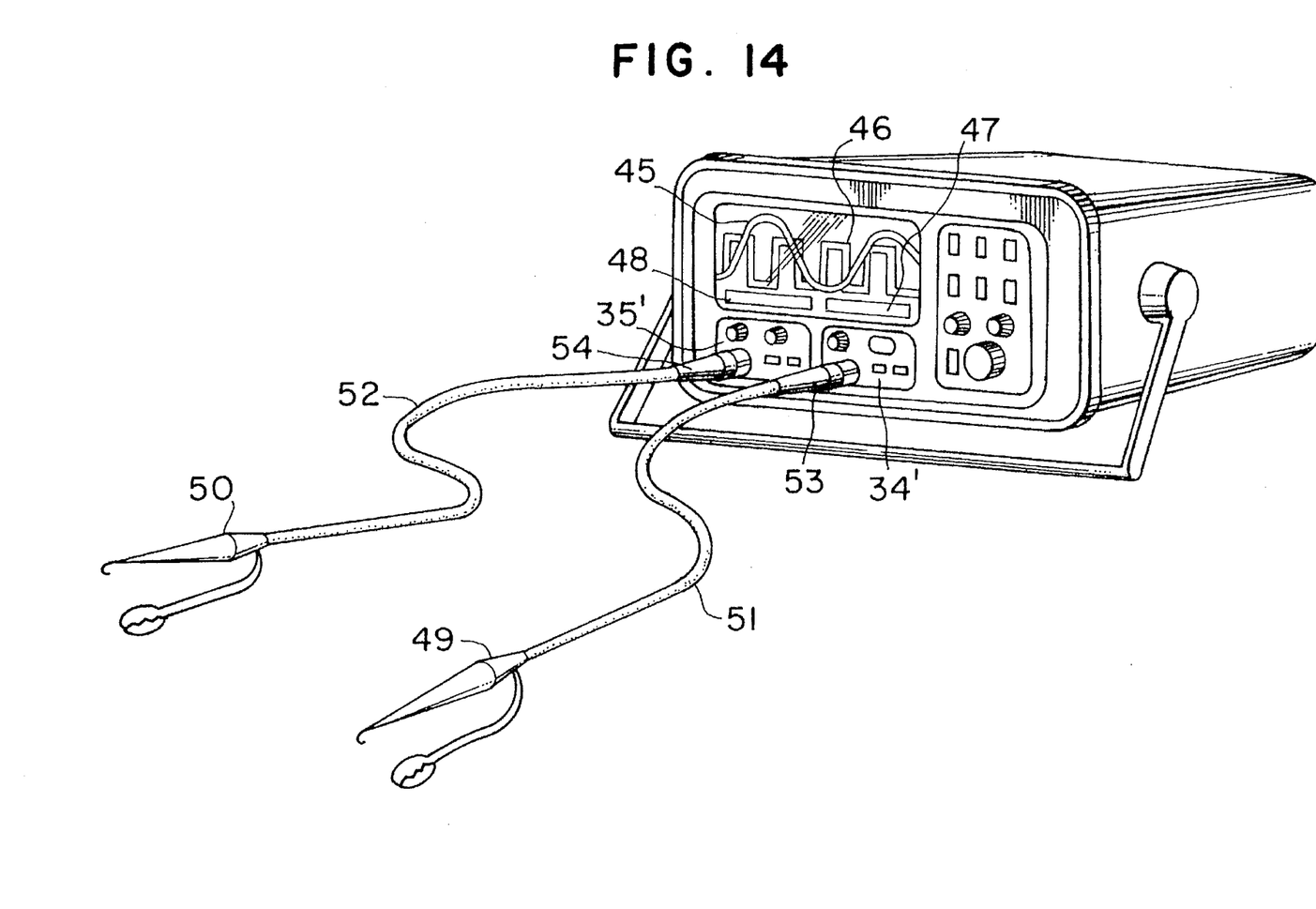
FIG. 14 is a perspective view of still another embodiment of the present invention.

FIG. 14 illustrates still another embodiment of an oscilloscope according to the present invention which is more typically shaped compared to the oscilloscope shown in FIG. 11.

The present invention is also applicable to such a typically-shaped oscilloscope. In this embodiment, in addition to the color-coding channel display 34' and 35' of the operating section, the probe system, such as probe input portions 49 (channel 1) and 50 (channel 2), cables 51 (channel 1) and 52 (channel 2) and probe connectors 53 (channel 1) and 54 (channel 2), are consistently colored corresponding to the respective channel colors. Instead of coloring the entire probe system including the cables corresponding to the channels, the probe input portions 49 and 50 only may be partially or entirely colored. Further, the probe connectors 53 and 54 may also be colored corresponding to the probe input portions 49 and 50.

Such probe coloring is certainly applicable to the oscilloscope shown in FIG. 11, in which case, the color displays corresponding to the channels may be performed near probe connectors 55 and 56, or alternatively, the letters of "CH1" and "CH2" may be colored corresponding to the channel colors. Such a modification is performed to prevent the foregoing connection mismatch which might occur when a probe is connected to a connector by corresponding the probe color to the channel.

As is clearly understood from the foregoing description, according to a second aspect of the present invention, it becomes possible to immediately and intuitively recognize a corresponding relationship between the display waveform and the operating section, thereby significantly enhancing operational performance.

What is claimed is:

1. An oscilloscope casing structure comprising:

a main unit having a unit base and a unit cover, said unit cover comprising at least a first portion and a second portion, an upper surface of which is provided at a height lower than an upper surface of said first portion;

an operating means arranged on the upper surface of said second portion of said unit cover, said operating means including a plurality of operational press buttons having a low height arranged at a center of said upper surface of said second portion of said unit cover and a plurality of operational turning knobs, each of which is higher than said press buttons and is arranged at the periphery of said upper surface of said second portion;

a display means constructed as a cover for said operating means when said display means is closed, said display means having a waveform display inside and recesses formed at a periphery thereof, the recesses being positioned so as to correspond to positions of the plurality of operational turning knobs, wherein said plurality of operational turning knobs extend within said recesses when said display means is closed; and a hinge for pivotally connecting said display means to said unit cover so that said display means can be opened and closed.

2. An oscilloscope casing structure according to claim 1, wherein said hinge includes: a lock mechanism-equipped hinge for holding said waveform display of said display means during the use of the oscilloscope at a desired angle in a range from upward to rearward, as viewed from the front surface of said main unit; and a cylindrical stationary shaft arranged on said main unit and a pivot bearing arranged on said display means so as to pass through electrical signal cables which connect said main unit and said display means.

3. An oscilloscope casing structure according to claim 2, wherein said stationary shaft has an axially-arranged slit.

4. An oscilloscope casing structure according to claim 1, wherein an input terminal for an electrical signal to be measured is placed further inward than the plane of the front surface of said main unit and an output terminal is placed at a rear surface.

5. An oscilloscope casing structure according to claim 1, wherein ventilating slots are arranged on the first portion of the unit cover.

\* \* \* \* \*